United States Patent
Cheng et al.

(10) Patent No.: US 7,622,945 B1
(45) Date of Patent: Nov. 24, 2009

(54) MIX MODE DRIVER FOR TRACES OF DIFFERENT LENGTHS

(75) Inventors: Christopher Cheng, Cupertino, CA (US); David Chu, Santa Clara, CA (US)

(73) Assignee: 3PAR, Inc., Fremont, CA (US)

( * ) Notice: Subject to any disclaimer, the term of this patent is extended or adjusted under 35 U.S.C. 154(b) by 471 days.

(21) Appl. No.: 11/614,031

(22) Filed: Dec. 20, 2006

(51) Int. Cl.
*H03K 19/003* (2006.01)
(52) U.S. Cl. .............................. 326/21; 326/31; 326/82
(58) Field of Classification Search .................. 326/21, 326/31, 82
See application file for complete search history.

(56) References Cited

U.S. PATENT DOCUMENTS 6,034,544 A * 3/2000 Agrawal et al. ............... 326/39
6,794,900 B2 * 9/2004 Tang et al. .................... 326/86
2003/0016189 A1 * 1/2003 Abe et al. ..................... 345/55

* cited by examiner

*Primary Examiner*—James Cho
(74) *Attorney, Agent, or Firm*—Patent Law Group LLP; David C. Hsia

(57) ABSTRACT

A method for a mix mode driver to accommodate traces of different lengths includes sequentially shifting values of a data signal to a number of stages and sequentially amplifying the values of the data signal at least one stage. Depending on the length of trace for the data signal, the method further includes providing at least one amplifying coefficient to at least one stage and coupling a subset of the stages to an adder. The method finally includes outputting the data signal from the adder to the trace.

12 Claims, 6 Drawing Sheets

MIX MODE DRIVER FOR TRACES OF DIFFERENT LENGTHS

FIELD OF INVENTION

This invention relates to drivers for signals over traces of different lengths.

DESCRIPTION OF RELATED ART

FIG. 1 illustrates a signal propagating through transmission lines of different lengths. Along the way, edges of the signal are degraded by metallic skin effect and dielectric loss. The signal will spread in time (common known as "dispersion") and decrease in amplitude (commonly known as "attenuation"). The signal becomes difficult to detect by circuitry at its destination as the transmission length increases.

FIG. 2 illustrates signals traveling along transmission line of increasing length. To mitigate edge degradation and improve signal detection, an extra boost of signal swing is added to a rising edges of the second and the third signals so that their edges are sharpened at their destinations. The amount of boost can be adjusted based on the length of the transmission line.

FIG. 3 is a block diagram of a conventional pre-emphasis driver circuitry 300 for generating a signal with an extra boost of signal swing in a rising edge. Driver circuitry 300 has two fixed stages in a normal driver 302 and a boost driver 304. While the number of stages is fixed, the strength of the boost provided by boost driver 304 may be calibrated based on the transmission length. The details of driver circuitry 300 are provided hereafter.

Normal driver 302 receives a data input signal and in response generates a data output signal. Boost driver 304 is coupled in parallel with normal driver 302 to add an extra boost of signal swing to the data output signal. Boost driver 304 has a control terminal coupled to receive a control signal from a timing circuitry 306. The control signal enables boost driver 304 to add the extra boost of signal swing to the data output signal.

Timing circuitry 306 includes D flip-flops 308 and 310, and an XOR gate 312. Flip-flop 308 has a data input terminal coupled to receive the data input signal. Flip-flop 310 has a data input terminal coupled to a data output terminal of flip-flop 308. Flip-flops 308 and 310 are clocked by a common clock signal at their clock terminals to sequentially shift out the data input signal. XOR gate 312 has two input terminals coupled to the data output terminals of flip-flops 308 and 310. In response, XOR gate 312 generates the control signal to boost driver 304.

Inputs of normal driver 302 and boost driver 304 are coupled in parallel to the output terminal of flip-flop 308. Boost driver 304 has its control terminal coupled to the output of logic gate 306.

FIG. 4 is a timing diagram that shows the operation of driver circuitry 300. Signal Data_in is the data input signal received by flip-flop 308, signal "d" is the output signal of flip-flop 308, signal "e" is the output signal of the flip-flop 310, signal "f" is the control signal generated by XOR gate 312, and signal Data_out_1 is the data output signal from drivers 302 and 304.

In the first clock cycle, signal Data_in transitions from low to high. Signals d and e remain low as flip-flops 308 and 310 output the states of signals Data_in and d from the previous clock signal. As signal d is low, driver 302 outputs a low signal Data_out_1. As signals d and e are both low, logic gate 312 generates a low signal f. As signal f is low, boost driver 304 does not provide an extra boost to signal Data_out_1.

In the second clock cycle, signal d transitions from low to high as flip-flop 308 outputs the state of signal Data_in from the previous clock cycle. In response to a high signal d, driver 302 outputs a high signal Data_out_1. Signal e remains low as flip-flop 310 outputs the state of signal d from the previous clock cycle. As signal d is high and signal e is low, XOR gate 312 generates a high signal f. In response to a high signal f, boost driver 304 adds the extra boost of swing to signal Data_out_1.

In the third clock signal, signals d and e remain high as flip-flops 308 and 310 output the states of signal Data_in and d from the previous clock cycle. As signals d and e are both high, XOR gate 312 generates a low signal f. In response to a low signal f, boost driver 304 does not provide the extra boost of swing and signal Data_out_1 drops to its normal amplitude. As can be seen, boost driver 304 adds the extra boost of swing to signal Data_out_1 for one clock cycle during the transition from low to high.

FIG. 5 illustrates signals traveling along transmission of increasing length. To mitigate edge degradation and improve signal detection, extra boosts of signal swing are added to rising and falling edges of the second and the third signals so that their edges are sharpened at their destinations. The amount of boost can be adjusted based on the length of the transmission line.

FIG. 6 is a block diagram of a conventional finite impulse response (FIR) driver circuitry 600 for generating a signal with extra boosts of signal swing in rising and falling edges. Driver circuitry 600 has three fixed stages in multipliers 606, 608, and 610 although different implementations can have additional fixed stages. Like driver circuitry 300, the number of stages is fixed but the strength of the boost provided by multipliers 606, 608, and 610 may be calibrated according to the transmission length. The details of driver circuitry 600 are provided hereafter.

A D flip-flop 602 has a data input terminal coupled to receive a data input signal. A D flip-flop 604 has a data input terminal coupled to a data output terminal of flip-flop 602. Flip-flops 602 and 604 are clocked by a common clock signal at their clock terminals to sequentially shift out the data input signal.

Multiplier 606 has an input terminal coupled to receive the data input signal in parallel with flip-flop 602. Multiplier 608 has an input terminal coupled to the output terminal of flip-flop 602 in parallel with flip-flop 604. Multiplier 610 has an input terminal coupled to an output terminal of flip-flop 604. Each multiplier generates an output signal that is the product of its coefficient and its input signal. The coefficients for multipliers 606, 608, and 610 are represented as −a, b, and −c in FIG. 6. An adder 612 has input terminals coupled to output terminals of multipliers 606, 608, and 610. Adder 612 generates a data output signal that is the sum of its inputs.

The output of driver circuitry 600 is the weighted sum of inputs $X_{n-1}$, $X_n$, and $X_{n+1}$ to multipliers 606, 608, and 610. The output of driver circuitry 600 at time n is provided in the Table 1 below according to the states of the inputs $X_{n-1}$, $X_n$, and $X_{n+1}$ of the data input signal Data_in at times n−1, n, and n+1.

TABLE 1

Output at time n according to input states at times n − 1, n, and n + 1

| Xn + 1 | Xn | Xn − 1 | Output − n |
|---|---|---|---|
| −1 | −1 | −1 | a − b + c |
| −1 | −1 | 1 | a − b − c |
| −1 | 1 | −1 | a + b + c |
| −1 | 1 | 1 | a + b − c |
| 1 | −1 | −1 | −a − b + c |
| 1 | −1 | 1 | −a − b − c |
| 1 | 1 | −1 | −a + b + c |
| 1 | 1 | 1 | −a + b − c |

FIGS. 7A, 7B, and 7C are timing diagrams that show the operation of driver circuitry 600 with three different streams of data input.

Referring to FIG. 7A, the data input stream consists of alternating states. In the first clock cycle, the three states of signal Data_in at times n−1, n, and n+1 are −1, 1, and −1. Referring to Table 1, the output of driver circuitry 600 is thus a+b+c. In the second clock cycle, the three states of signal Data_in at times n−1, n, and n+1 are 1, −1, and 1. Referring to Table 1, the output of driver circuitry 600 is thus −a−b−c. As the data input stream repeats, the same outputs are also repeated in subsequent clock cycles.

Referring to FIG. 7B, the data input stream consists of a single transition from low to high. In the first clock cycle, the three states of signal Data_in at times n−1, n, and n+1 are −1, −1, and −1. Referring to Table 1, the output of driver circuitry 600 is thus a−b+c. In the second clock cycle, the three states of signal Data_in at times n−1, n, and n+1 are −1, −1, and 1. Referring to Table 1, the output of driver circuitry 600 is thus −a−b+c. In the third clock cycle, the three states of Data_in at times n−1, n, and n+1 are −1, 1, and 1. Referring to Table 1, the output of driver circuitry 600 is thus −a+b+c. In the fourth clock cycle, the three states of Data_in at times n−1, n, and n+1 are 1, 1, and 1. Referring to Table 1, the output of driver circuitry 600 is thus −a+b−c. As the data input stream then remains high, the same output is repeated in the subsequent clock cycles.

Referring to FIG. 7C, the data input stream consists of a transition from low to high, one clock cycle in the high state, and a transition from high to low. In the first clock cycle, the three states of signal Data_in at times n−1, n, and n+1 are −1, −1, and −1. Referring to Table 1, the output of driver circuitry 600 is thus a−b+c. In the second clock cycle, the three states of signal Data in at times n−1, n, and n+1 are −1, −1, and 1. Referring to Table 1, the output of driver circuitry 600 is thus −a−b+c. In the third clock cycle, the three states of Data_in at times n−1, n, and n+1 are −1, 1, and 1. Referring to Table 1, the output of driver circuitry 600 is thus −a+b+c. In the fourth clock cycle, the three states of Data_in at times n−1, n, and n+1 are 1, 1, and −1. Referring to Table 1, the output of driver circuitry 600 is thus −a+b−c. In the fifth clock cycle, the three states of Data_in at times n−1, n, and n+1 are 1, −1, −1. Referring to Table 1, the output of driver circuitry 600 is thus a−b−c. In the sixth clock cycle, the three states of Data_in at times n−1, n, and n+1 are −1, −1, −1. Referring to Table 1, the output of driver circuitry 600 is thus a−b+c.

SUMMARY

In one embodiment of the invention, a method for a mix mode driver to accommodate traces of different lengths includes sequentially shifting values of a data signal to a number of stages and sequentially amplifying the values of the data signal at least one stage. Depending on the length of trace for the data signal, the method further includes providing at least one amplifying coefficient to at least one stage and coupling a subset of the stages to an adder. The method finally includes outputting the data signal from the adder to the trace.

BRIEF DESCRIPTION OF THE DRAWINGS

Use of the same reference numbers in different figures indicates similar or identical elements.

DETAILED DESCRIPTION

Figure 1:
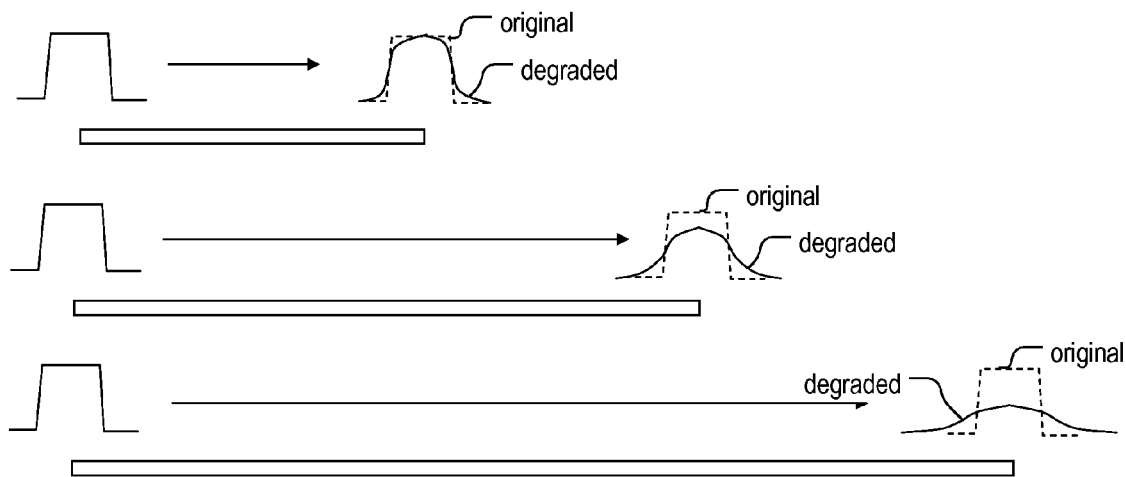
FIG. 1 illustrates the degradation of a signal as it travels through transmission lines of various lengths.
Figure 2:
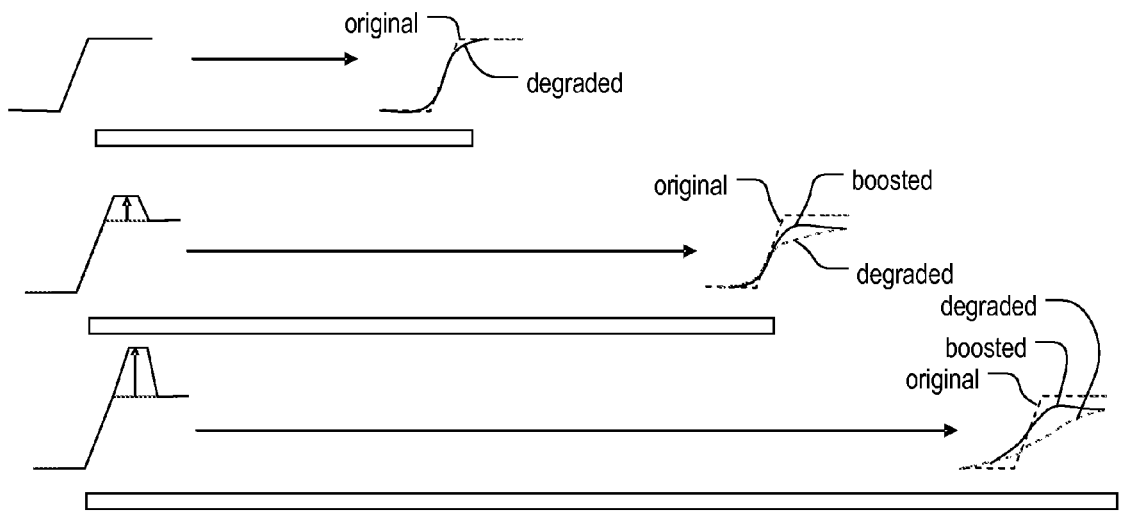
FIG. 2 illustrates boosts in the swing of signals and the degradation of the signals as they travel through transmission lines of various lengths in one embodiment of the invention.
Figure 3:
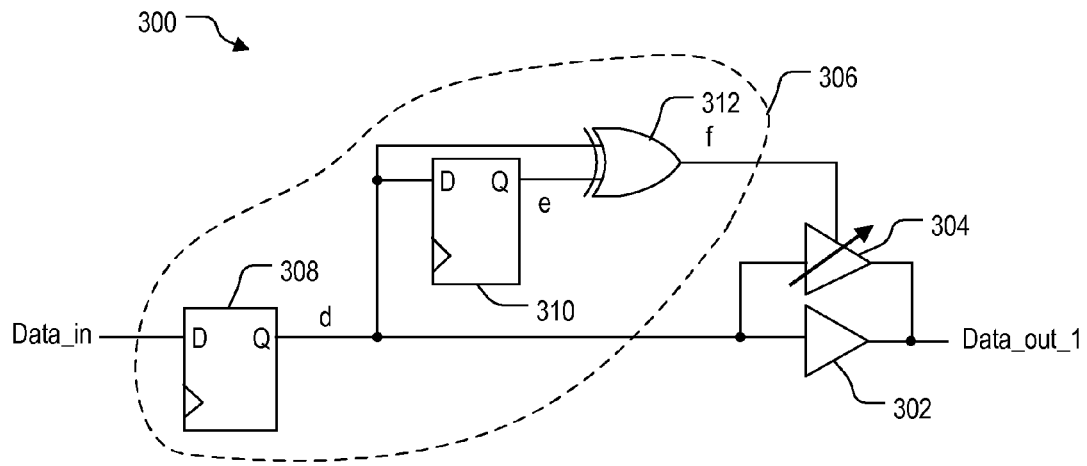
FIG. 3 is a block diagram of a driver circuitry that provides the boost in signal swing shown in FIG. 2 in one embodiment of the invention.
Figure 4:
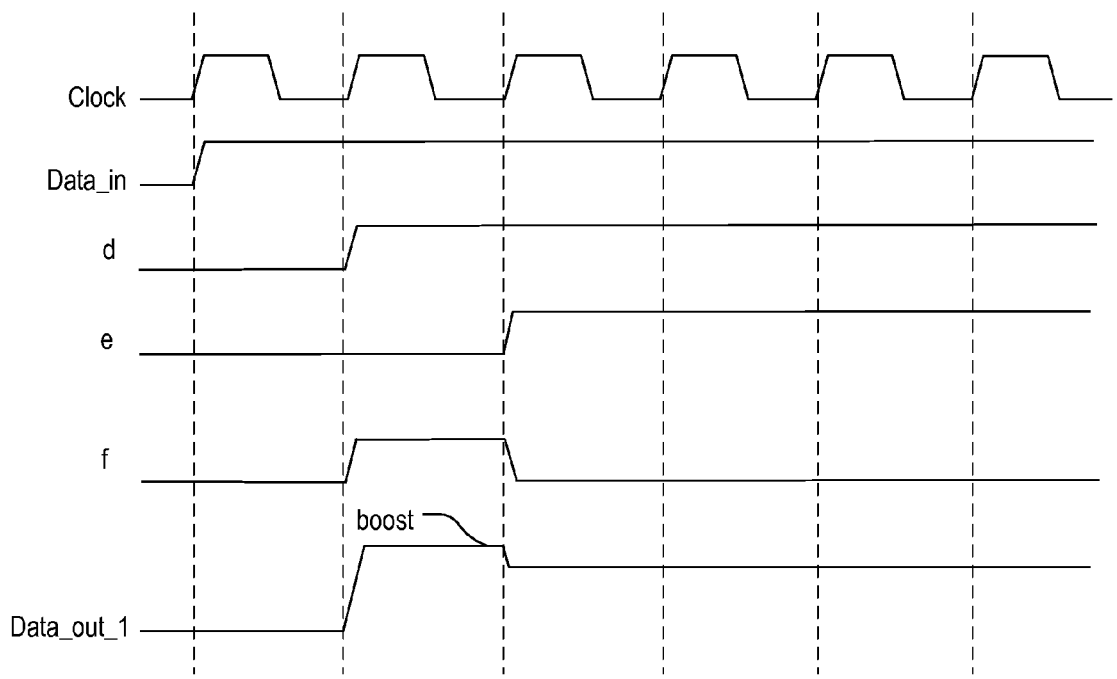
FIG. 4 is a timing diagram for the driver circuitry of FIG. 3.
Figure 5:
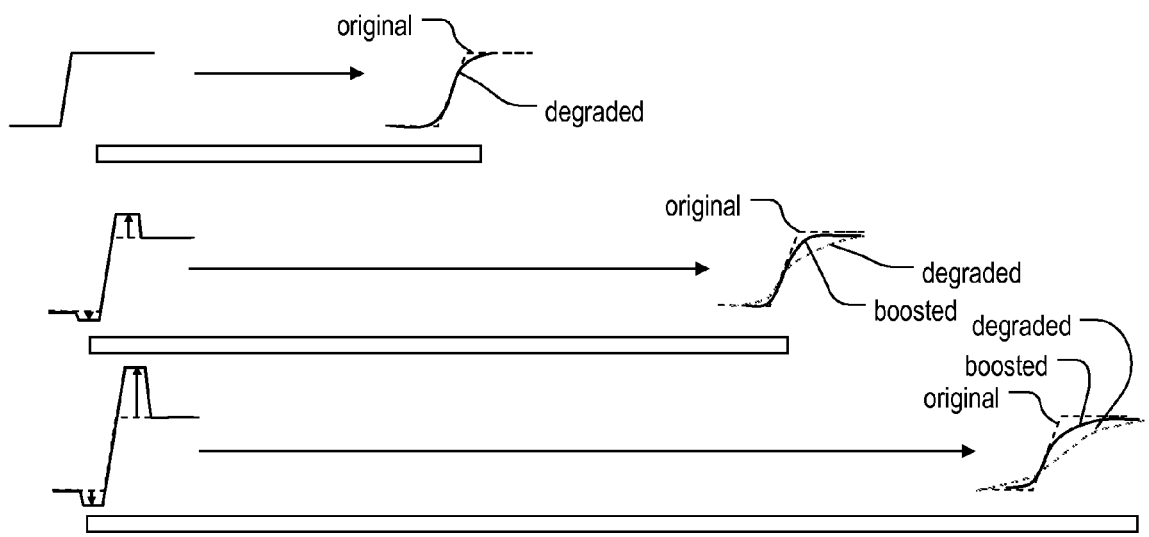
FIG. 5 illustrates boosts in the swing of signals and the degradation of the signals as they travel through transmission lines of various lengths.
Figure 6:
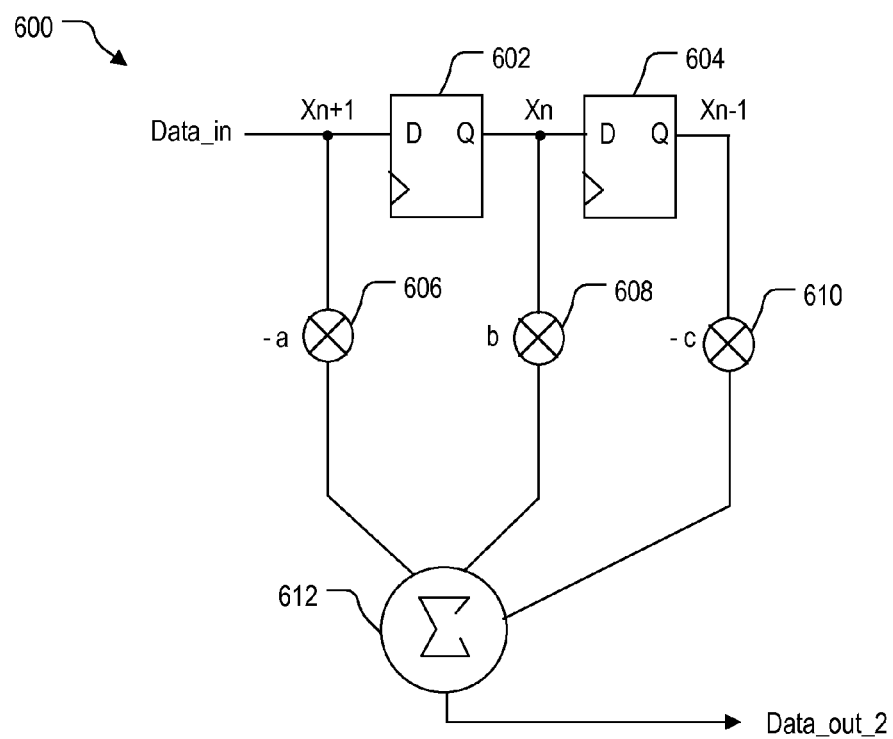
FIG. 6 is a block diagram of a driver circuitry that provides the boosts in signal swing shown in FIG. 5.
Figure 7A:
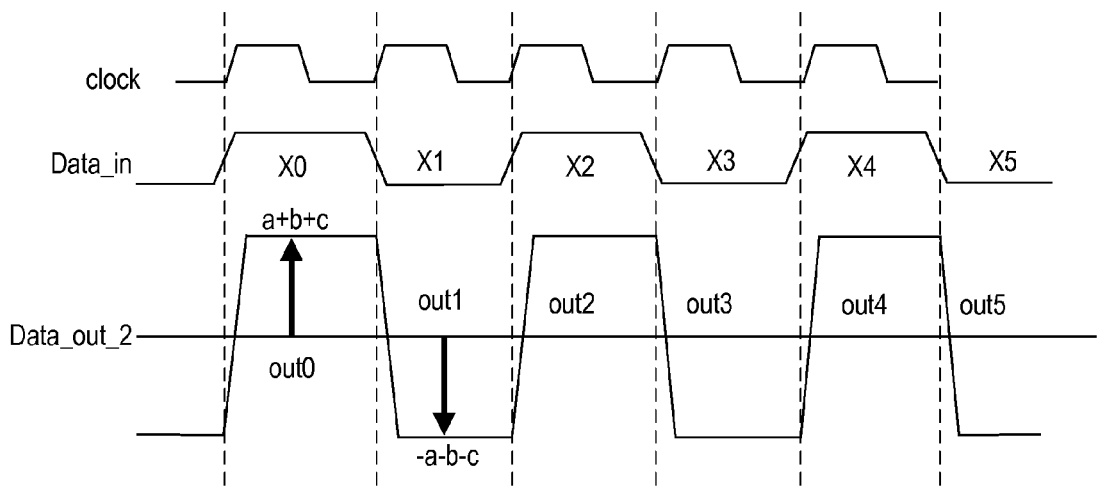
FIGS. 7A, 7B, and 7C are timing diagrams for the driver circuitry of FIG. 5.
Figure 7B:
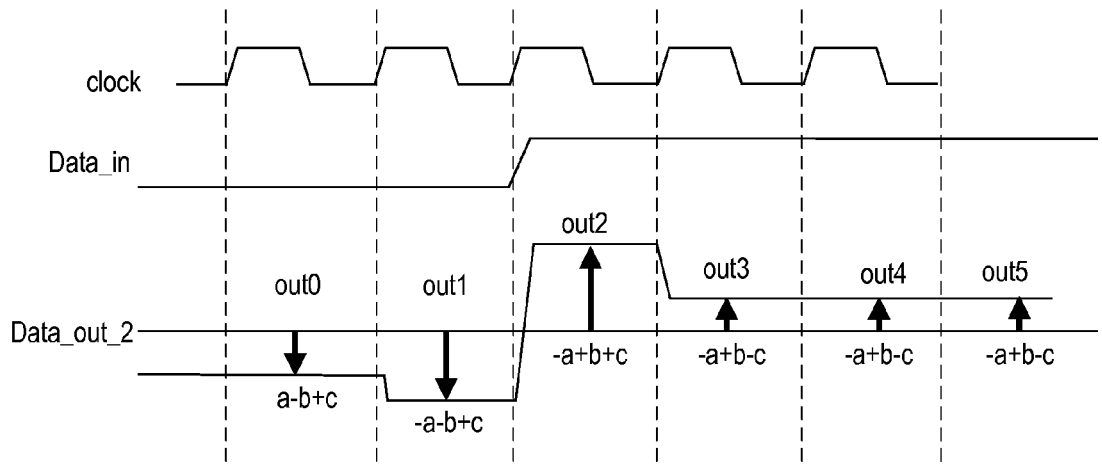
Figure 7C:
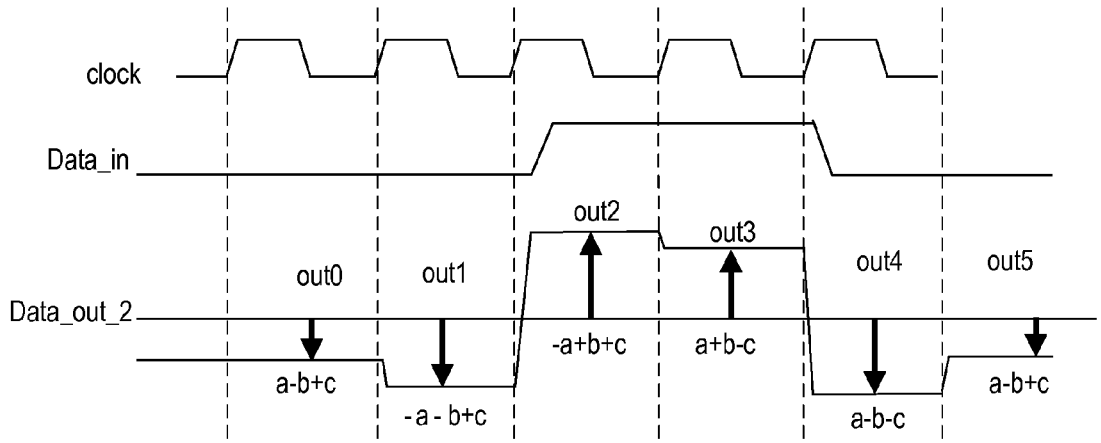
Figure 8:
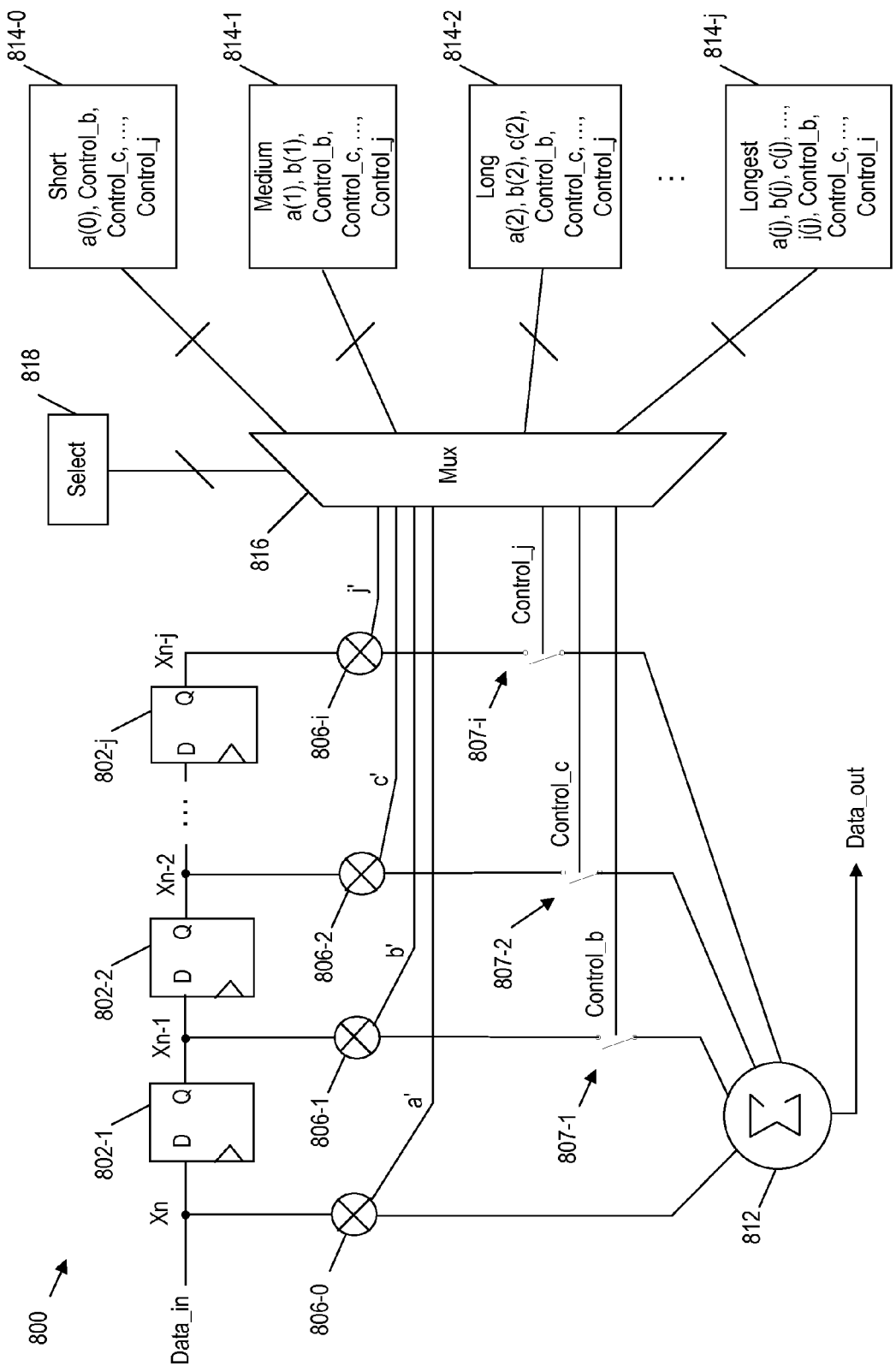
FIG. 8 is a block diagram of a mix mode driver circuitry in one embodiment of the invention.

FIG. 8 illustrates a mix mode driver circuitry 800 in one embodiment of the invention. Driver circuitry 800 is configurable to provide outputs similar to driver circuitries 300 and 600 based on the transmission length. Instead of changing the boosts of fixed stages based on transmission length as in driver circuitries 300 and 600, the boost is fixed but the number of stages in driver circuitry 800 is changed based on the transmission length. The number of stages is changed by configuring switches that connect multipliers to an adder. Coefficients for the multipliers are fixed for different groups of transmission lengths. The details of driver circuitry 800 are provided hereafter.

Driver circuitry 800 includes a chain of flip-flops 802-1, 802-2 . . . 802-j coupled in series. Flip-flop 802-1 has a data input terminal coupled to receive the data input signal, and each flip-flop down the chain has a data input terminal coupled to the data output terminal of the previous flip-flop in the chain. Flip-flops 802-1 to 802-j are clocked by a common clock signal at their clock terminals to sequentially shift out the data input signal. In one embodiment, flip-flops 802-1 to 802-j are D flip-flops.

A multiplier 806-0 has a data input terminal coupled to receive the data input signal in parallel with flip-flop 802-1. Multipliers 806-1, 806-2 . . . 806-j have data input terminals coupled to the respective data output terminals of flip-flop 802-1, 802-1 . . . 802-j. Each multiplier generates a data output signal that is the product of its coefficient and its data input signal. The coefficients for multipliers 806-0, 806-1, 806-2 . . . 806-j are represented as a', b', c' . . . j' in FIG. 8.

The data output terminal of multiplier 806-0 is connected to one of the data input terminals of an adder 812. The data output terminals of multipliers 806-1, 806-2 . . . 806-j are coupled by respective switches 807-1, 807-2 . . . 807-j to the data input terminals of adder 812. Adder 812 generates a data output signal that is the sum of its inputs.

Each of control registers 814-0, 814-1, 814-2 . . . 814-j stores a set of values of coefficients a' to j' and control bits for switches 807-1 to 807-j for a transmission length. A multiplexer 816 selectively couples one of control registers 814-0 to 814-j to multipliers 806-0 to 806-j and switches 807-1 to 807-j according to select signals from a control register 818 set by the user. In one embodiment, control register 814-0 configures driver circuitry 800 for short transmission so that driver circuitry 800 functions as a normal driver. In one embodiment, control register 814-1 configures driver circuitry 800 for medium transmission so that driver circuitry 800 functions like driver circuitry 300. In one embodiment, control register 814-2 configures driver circuitry 800 for long transmission so that driver circuitry 800 functions like driver circuitry 600. One skilled in the art understands that additional stages and control registers can be added to configure driver circuitry 800. Below are three tables listing values of multiplier coefficients and control bits in registers 814-0 to 814-2.

TABLE 2

Control register 814-0 for short transmission

| a' | b' | c' | ... | j' | Control_b | Control_c | ... | Control_j |
|---|---|---|---|---|---|---|---|---|
| a(0) | Do not care | Do not care | Do not care | Do not care | Open | Open | Open | Open |

As one can see from Table 2 for short transmission, the control bits disconnect multipliers 806-1 to 806-j from adder 812 so only multiplier 806-0 boosts the data output signal. The value of multiplier coefficient a' is set to a(0), which is the maximum boost at all time for driver circuitry 800.

TABLE 3

Control register 812-1 for medium transmission

| a' | b' | c' | ... | j' | Control_b | Control_c | ... | Control_j |
|---|---|---|---|---|---|---|---|---|
| a(1) | −b(1) | Do not care | Do not care | Do not care | Close | Open | Open | Open |

As one can see from Table 3 for medium transmission, the control bits disconnect multipliers 806-2 to 806-j from adder 812 so only multipliers 806-0 and 806-1 boost the data output signal. To always provide the maximum boost regardless of the transmission length, the sum of coefficient values a(1) and b(1) is equal to coefficient value a(0) in Table 2.

The output of driver circuitry 800 at time n is provided in the Table 4 below according to the states of the inputs Xn−1 and Xn of the data input signal Data_in at times n−1 and n.

TABLE 4

Output at time n according to input states at times n − 1 and n

| Xn | Xn − 1 | Output − n |
|---|---|---|
| −1 | −1 | −a(1) + b(1) |
| −1 | 1 | −a(1) − b(1) |
| 1 | 1 | a(1) − b(1) |
| 1 | −1 | a(1) + b(1) |

Figure 9:
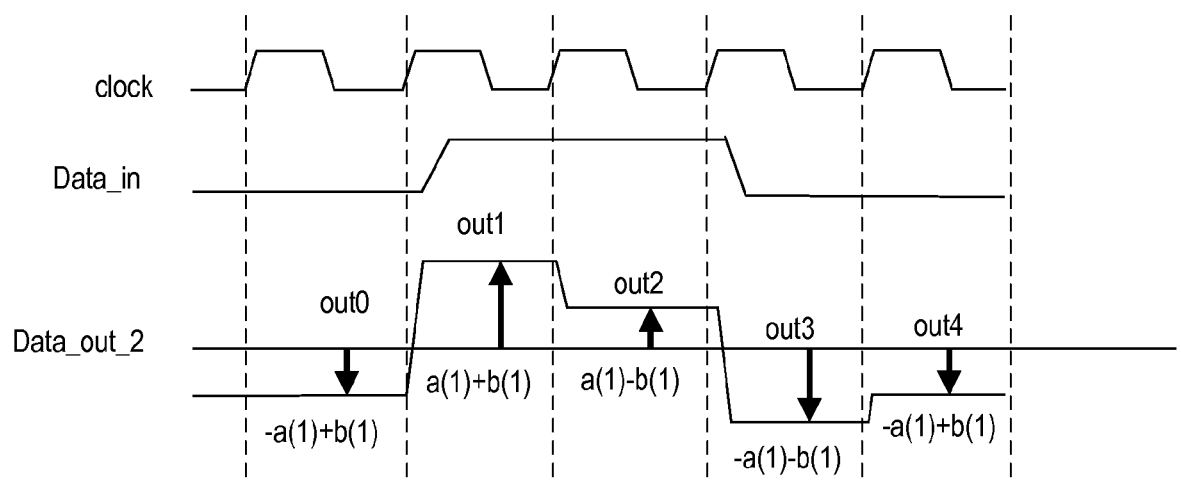
FIG. 9 is a timing diagram for the driver circuitry of FIG. 8 utilizing two stages in one embodiment of the invention.

Referring to FIG. 9, the data input stream consists of a single transition from low to high. In the first clock cycle, the two states of signal Data_in at times n−1 and n are −1 and −1. Referring to Table 4, the output of driver circuitry 800 is thus −a(1)+b(1). In the second clock cycle, the two states of signal Data_in at times n−1 and n are −1 and 1. Referring to Table 4, the output of driver circuitry 800 is thus a(1)+b(1). In the third clock cycle, the two states of Data_in at times n−1 and n are 1 and 1. Referring to Table 4, the output of driver circuitry 800 is thus a(1)−b(1). In the fourth clock cycle, the two states of Data_in at times n−1 and n are 1 and −1. Referring to Table 4, the output of driver circuitry 800 is thus −a(1)−b(1). As the data input stream then remains low, the same output is repeated in the subsequent clock cycles. The maximum boost of the two stages is a(1)+b(1), which is set equal to a(0) so that the signals of different transmission lengths have the same maximum boost.

TABLE 5

| | | | | | Control register 812-2 for long transmission | | | |
|---|---|---|---|---|---|---|---|---|
| a' | b' | c' | ... | j' | Control_b | Control_c | ... | Control_j |
| −a(2) | b(2) | −c(2) | Do not care | Do not care | Close | Close | Open | Open |

As one can see from Table 5 for long transmission, the control bits disconnect multipliers 806-3 to 806-*j* from adder 812 so only multipliers 806-0 to 806-2 boost the data output signal as in driver circuitry 600. To always provide the maximum boost regardless of the transmission length, the sum of coefficient values a(2), b(2), and c(2) is equal to coefficient value a(0) in Table 2. The operation of the three stage driver circuitry 800 is same as driver circuitry 600.

Note that the maximum boost occurs later as the number of stages is increased. Thus a conventional FIR driver with many fixed stages has large latency. However, driver circuitry 800 reduces the latency by using only the number of stages necessary for each transmission length.

Furthermore, note that the steady state voltage swing becomes lower as the number of stages is increased. This is because most coefficients used in the convention FIR driver are negative. However, driver circuitry 800 generally has a greater steady state voltage swing by using only the number of stages necessary for each transmission length.

Various other adaptations and combinations of features of the embodiments disclosed are within the scope of the invention. Numerous embodiments are encompassed by the following claims.

What is claimed is:

1. A method for a mix mode driver to accommodate traces of different lengths, comprising:
    sequentially shifting values of a data signal to a plurality of stages;
    sequentially amplifying the values of the data signal at least one stage;
    depending on a length of trace for the data signal:
        providing at least one coefficient to at least one stage, the at least one stage amplifying the values of the data signal according to the at least one coefficient; and
        coupling a subset of the stages to an adder; and
    outputting the data signal from the adder to the trace.

2. The method of claim 1, wherein said sequentially shifting comprises sequentially shifting the values of the data signal with serially connected flip-flops.

3. The method of claim 2, wherein the stages comprise multipliers and said providing at least one coefficient comprises using a multiplexer to selectively couple one of multiple registers to the stages, the registers storing values of at least one coefficient.

4. The method of claim 3, wherein said coupling a subset of the stages comprises using the multiplexer to selectively couple one of the multiple registers to switches that connect the stages to the adder, the registers storing control values to close or open the switches.

5. The method of claim 1, wherein if the length of the trace is a first length, said coupling a subset of the stages to an adder comprises coupling only one stage to the adder.

6. The method of claim 5, wherein if the length of the trace is a second length greater than the first length, said coupling a subset of the stages to an adder comprises coupling two stages to the adder.

7. The method of claim 6, wherein a coefficient for the one stage is equal to a sum of coefficients for the two stages.

8. The method of claim 6, wherein if the length of the trace is a third length greater than the second length, said coupling a subset of the stages to an adder comprises coupling three stages to the adder.

9. The method of claim 8, wherein a coefficient for the one stage is equal to a sum of coefficients for the three stages.

10. A mix mode driver for accommodating traces of different lengths, comprising:
    a first flip-flop having a data input terminal coupled to a data input line;
    a first multiplier having an input terminal coupled to the data input line, the first multiplier comprising a first coefficient;
    a second flip-flop having a data input terminal coupled to a data output terminal of the first flip-flop;
    a second multiplier having an input terminal coupled to the data output terminal of the first flip-flop, the second multiplier comprising a second coefficient;
    a first switch having an input terminal coupled to an output terminal of the second multiplier;
    a third multiplier having an input terminal coupled to a data output terminal of the second flip-flop, the third multiplier comprising a third coefficient;
    a second switch having an input terminal coupled to an output terminal of the third multiplier; and
    an adder having input terminals coupled to respective output terminals of the first multiplier, the first switch, and the second switch.

11. The mix mode driver of claim 10, further comprising:
    a plurality of registers, each register storing one or more coefficient values for the first multiplier, the second multiplier, and the third multiplier, and control bits for the first switch and the second switch; and
    a multiplexer coupling control terminals of the first multiplier, the second multiplier, the third multiplier, the first switch, and the second switch to one of the registers.

12. The mix mode driver of claim 11, further comprising:
    a third flip-flop having a data input terminal coupled to a data output terminal of the second flip-flop;
    a fourth multiplier having an input terminal coupled to a data output terminal of the third flip-flop, the fourth multiplier comprising a fourth coefficient;
    a third switch having an input terminal coupled to an output terminal of the fourth multiplier;
    wherein:
        the adder further has an input terminal coupled to an output terminal of the third switch;
        the multiplexer further couples a control terminal of the third switch to one of the registers, each register further storing a control bit for the third switch.

* * * * *

UNITED STATES PATENT AND TRADEMARK OFFICE
CERTIFICATE OF CORRECTION

PATENT NO. : 7,622,945 B1 Page 1 of 1
APPLICATION NO. : 11/614031
DATED : November 24, 2009
INVENTOR(S) : Christopher Cheng and David Chu It is certified that error appears in the above-identified patent and that said Letters Patent is hereby corrected as shown below:

At column 7, Line 39, where "the data signal at least" should read

--the data signal at at least--.

Signed and Sealed this

Second Day of February, 2010

David J. Kappos
*Director of the United States Patent and Trademark Office*